(12) United States Patent
Takeshima et al.

(10) Patent No.: US 11,792,930 B2
(45) Date of Patent: Oct. 17, 2023

(54) WIRING SUBSTRATE, ELECTRONIC DEVICE, AND ELECTRONIC MODULE

(71) Applicant: KYOCERA Corporation, Kyoto (JP)

(72) Inventors: Yuki Takeshima, Kyoto (JP); Yoshihiro Hosoi, Kyoto (JP)

(73) Assignee: Kyocera Corporation, Kyoto (JP)

( * ) Notice: Subject to any disclaimer, the term of this patent is extended or adjusted under 35 U.S.C. 154(b) by 202 days.

(21) Appl. No.: 17/442,160

(22) PCT Filed: Mar. 25, 2020

(86) PCT No.: PCT/JP2020/013314
§ 371 (c)(1),
(2) Date: Sep. 23, 2021

(87) PCT Pub. No.: WO2020/196616
PCT Pub. Date: Oct. 1, 2020

(65) Prior Publication Data
US 2022/0192022 A1 Jun. 16, 2022

(30) Foreign Application Priority Data
Mar. 25, 2019 (JP) .................................. 2019-056788

(51) Int. Cl.
*H05K 1/00* (2006.01)
*H05K 1/02* (2006.01)
*H05K 1/03* (2006.01)
*H05K 3/38* (2006.01)
*H01L 23/15* (2006.01)
(Continued)

(52) U.S. Cl.
CPC .............. *H05K 1/141* (2013.01); *H05K 3/181* (2013.01); *H05K 3/38* (2013.01)

(58) Field of Classification Search
CPC .. H05K 1/00; H05K 1/02; H05K 1/03; H05K 1/141; H05K 3/062; H05K 3/065; H05K 3/38; H05K 3/108; H05K 3/181; H05K 3/244; H01L 21/4846; H01L 23/15; H01L 23/498; H01L 23/4846; H01L 23/49866; H01L 23/49877; H01L 24/03; H01L 24/11; H01L 24/12; H01L 24/16; H01L 24/72; H01L 24/73; H01L 24/90; H01L 24/91
USPC ............ 174/250; 257/692, E23.009, E23.01, 257/E23.68, E23.74, E23.106; 428/210, 428/627, 629, 632, 661, 674, 834; 29/832, 846, 847
See application file for complete search history.

(56) References Cited

U.S. PATENT DOCUMENTS 4,985,313 A * 1/1991 Penneck ................ H01B 3/105
428/629
5,928,768 A * 7/1999 Ikeda ...................... H01L 23/15
428/209
(Continued)

FOREIGN PATENT DOCUMENTS

JP          05-182926 A      7/1993

*Primary Examiner* — Xiaoliang Chen
(74) *Attorney, Agent, or Firm* — Volpe Koenig (57) ABSTRACT

A wiring substrate includes an insulating substrate, a conductor and an Ni film. The insulating substrate has a first surface and a second surface on a side opposite the first surface, and contains AlN. The conductor is disposed on the first surface and contains Cu. The Ni film is disposed so as to extend across an upper surface and a side surface of the conductor to the first surface. Ti oxide is scattered so as to be at a plurality of points on the first surface.

14 Claims, 6 Drawing Sheets

(51) Int. Cl.
  *H01L 23/498* (2006.01)
  *H05K 1/14* (2006.01)
  *H05K 3/18* (2006.01)

(56) References Cited

U.S. PATENT DOCUMENTS

| | | | | |
|---|---|---|---|---|
| 2003/0005582 | A1* | 1/2003 | Tatoh | H01L 21/4846 |
| | | | | 174/250 |
| 2003/0070292 | A1* | 4/2003 | Tatoh | H05K 3/108 |
| | | | | 257/E23.06 |
| 2007/0267735 | A1* | 11/2007 | Awano | H01L 24/91 |
| | | | | 977/932 |
| 2013/0216864 | A1* | 8/2013 | Takizawa | G11B 5/855 |
| | | | | 427/130 |
| 2015/0173202 | A1* | 6/2015 | Anosov | H01L 23/498 |
| | | | | 29/847 |
| 2016/0005639 | A1* | 1/2016 | Ono | C04B 37/026 |
| | | | | 361/234 |
| 2017/0263817 | A1* | 9/2017 | Hirano | H01L 33/32 |

* cited by examiner

WIRING SUBSTRATE, ELECTRONIC DEVICE, AND ELECTRONIC MODULE

TECHNICAL FIELD

The present disclosure relates to a wiring substrate, an electronic device and an electronic module.

BACKGROUND

There has been known a wiring substrate in which an Al-based wiring conductor is disposed on an Si substrate with an insulating film and a titanium-based metal film in between. (See, for example, JPH 05-182926).

SUMMARY

A wiring substrate according to the present disclosure includes:

an insulating substrate having a first surface and a second surface on a side opposite the first surface, and containing AlN;

a conductor disposed on the first surface and containing Cu; and an Ni film disposed so as to extend across an upper surface and a side surface of the conductor to the first surface, wherein Ti oxide is scattered so as to be at a plurality of points on the first surface, and wherein the Ni film has a part that is in contact with the Ti oxide.

An electronic device according to the present disclosure includes:

the above wiring substrate; and
an electronic component mounted on the wiring substrate.

An electronic module according to the present disclosure includes:

the above electronic device; and
a module board where the electronic device is mounted.

DETAILED DESCRIPTION

Hereinafter, one or more embodiments of the present disclosure will be described in detail with reference to the drawings.

Figure 1A:
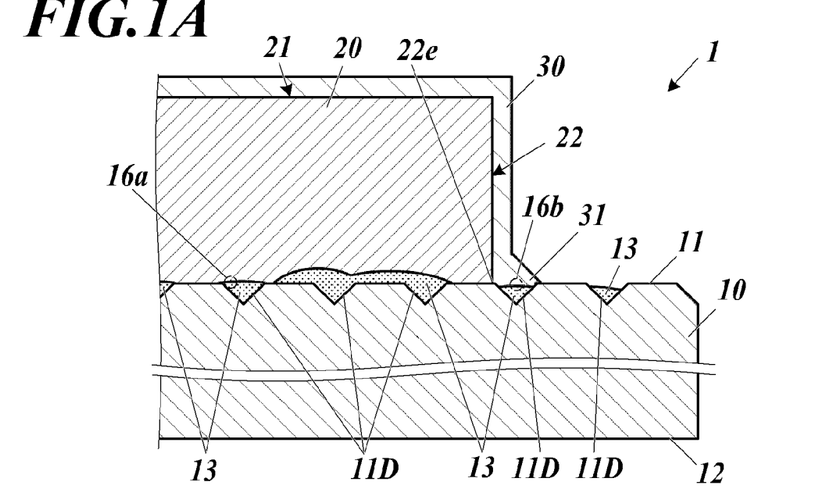
FIG. 1A is a vertical sectional view showing part of a wiring substrate of an embodiment.
Figure 1B:
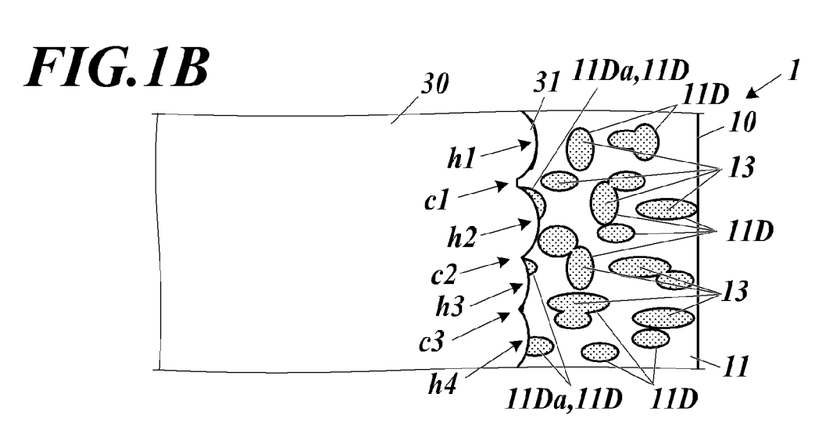
FIG. 1B is a plan view showing part of the wiring substrate of the embodiment.
Figure 1C:
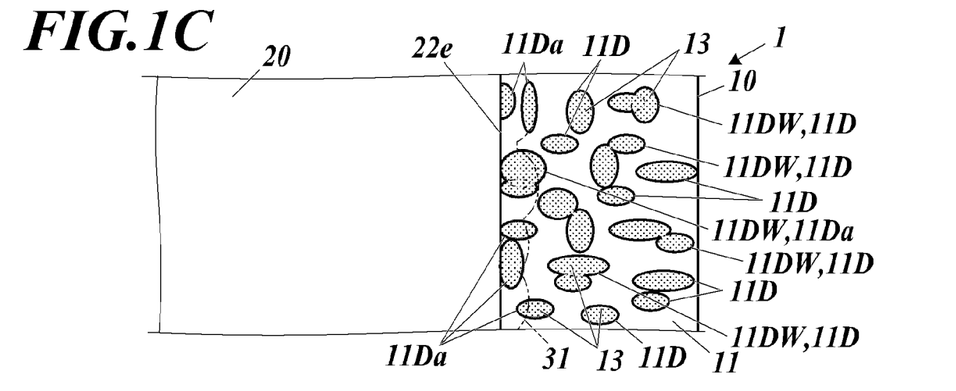
FIG. 1C is a plan view showing the wiring substrate of the embodiment with an Ni film removed.
Figure 2:
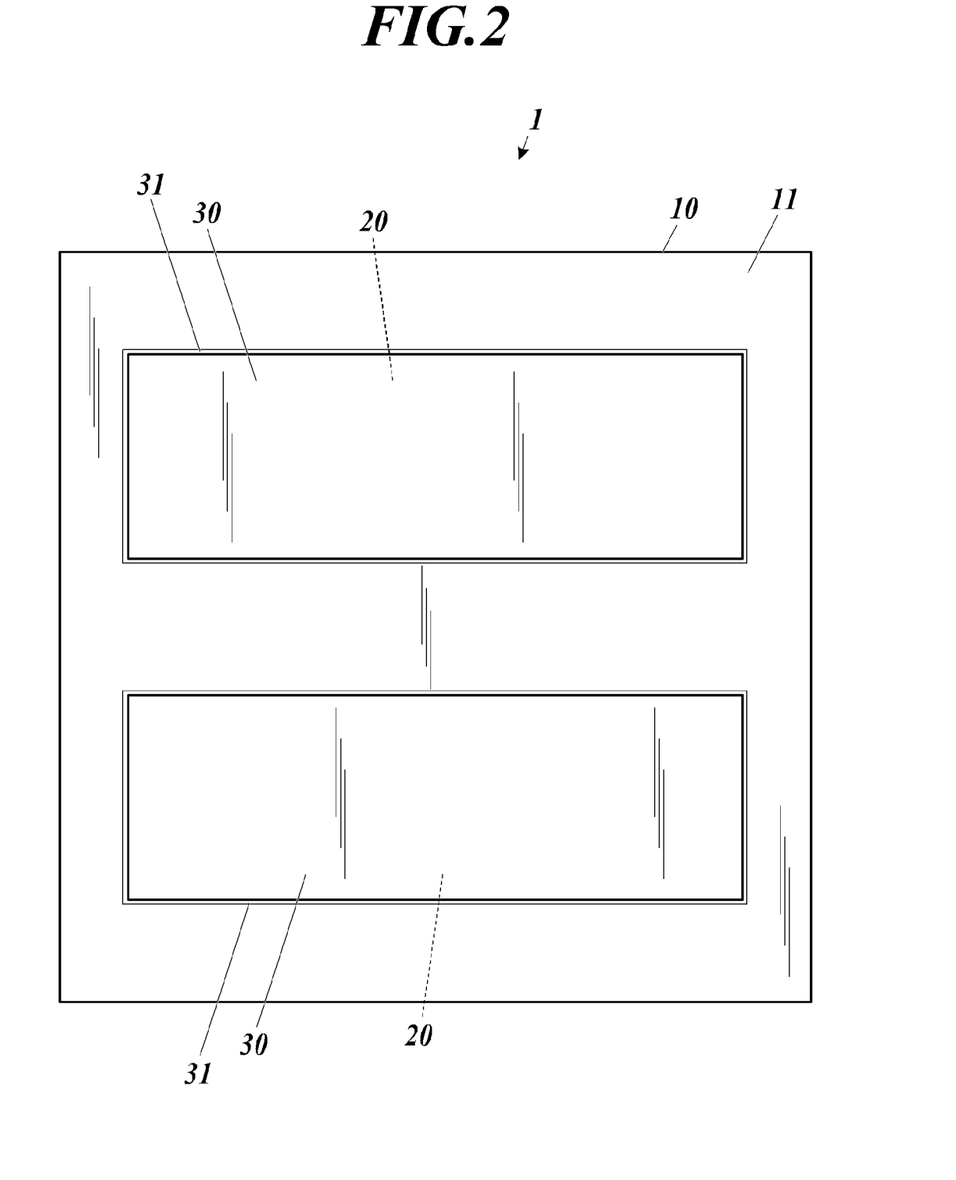
FIG. 2 is a plan view of the entire wiring substrate of the embodiment.

FIG. 1A to FIG. 1C each show part of a wiring substrate of an embodiment, wherein FIG. 1A is a vertical sectional view thereof, FIG. 1B is a plan view thereof, and FIG. 1C is a plan view thereof with an Ni (nickel) film removed. FIG. 2 is a plan view of the entire wiring substrate of the embodiment. In this description, explanation is made with a direction from a second surface 12 to a first surface 11 of an insulating substrate 10 regarded as upward. However, directions described in this description may be different from directions of a wiring substrate 1 when it is mounted or used.

The wiring substrate 1 of this embodiment is, for example, a submount that is, for mounting an electronic component on a module board or in a package, interposed between the electronic component and the mounting destination. The wiring substrate 1 includes the insulating substrate 10 made of a ceramic material containing AlN (aluminum nitride), a wiring conductor 20 formed on the insulating substrate 10, and an Ni film 30 covering the upper surface and the side surface of the wiring conductor 20. The wiring conductor 20 corresponds to an example of a conductor according to the present disclosure.

The insulating substrate 10 is made of a ceramic material containing AlN as a constituent element. The insulating substrate 10 has a first surface (first main surface) 11 and a second surface (second main surface) 12 on the opposite side. The wiring conductor 20 is formed on the first surface 11. The wiring conductor 20 may be formed on each of the first surface 11 and the second surface 12 of the insulating substrate 10. In a case where the wiring conductor 20 on the second surface 12 is regarded as the conductor according to the present disclosure, the second surface 12 corresponds to the first surface according to the present disclosure, and the first surface 11 corresponds to the second surface according to the present disclosure.

On the first surface 11 of the insulating substrate 10, as shown in FIG. 1A to FIG. 1C, a plurality of Ti oxides 13 is scattered. In other words, Ti oxide 13 is scattered all over the first surface 11 in the plane direction thereof so as to be present at various points thereon. The Ti oxides 13 may each be, for example, $TiO_2$ (titanium oxide). The Ti oxides 13 may be disposed in recesses 11D of the first surface 11 described below.

The insulating substrate 10 has minute recesses 11D on the first surface 11. The recesses 11D may each have an opening having a maximum width of, for example, 1 μm to 20 μm. On the first surface 11, the recesses 11D may be provided at an area ratio of 10% to 60%. The recesses 11D are formed all over the first surface 11, but may be formed only at a part(s) that the Ni film 30 contacts. Hereinafter, explanation is made with the recesses 11D regarded as points where the Ti oxides 13 are present on the first surface 11.

The recesses 11D include compound recesses 11DW (shown in FIG. 1C) each having a shape of two or more recesses overlapped if the plane shape of each recess 11D is regarded as granular.

The wiring conductor 20 is a conductor made of Cu (copper) as a main component, and is formed on the insulating substrate 10 having a layer of the Ti oxides 13 in between. In a sintering step described below, the Ti oxides 13 may gather in the recesses 11D, and the interface between the insulating substrate 10 and the wiring conductor 20 may include parts where the layer of the Ti oxides 13 remains and parts where the layer of the Ti oxides 13 has disappeared. At parts where the Ti oxides 13 gather in the recesses 11D under the wiring conductor 20, an interlayer 16a (FIG. 1A) where atoms other than the Ti oxides 13 interdiffuse is formed. Further, in the recesses 11D that the Ni film 30 contacts, a similar interlayer 16b (FIG. 1A) may remain.

The Ni film 30 is a film made of Ni as a main component, and covers the upper surface 21 and the side surface 22 of the wiring conductor 20 until it reaches a part of the first surface 11 of the insulating substrate 10. The Ni film 30 has, at its foot near the first surface 11 of the insulating substrate 10, a protrusion 31 that protrudes to the side opposite the wiring conductor 20. The outer edge of the protrusion 31 has a plurality of hills h1 to h4 and a plurality of valleys c1 to c3 as viewed in a direction perpendicular to the first surface 11 of the insulating substrate 10 (FIG. 1B).

The Ni film 30 is in contact with some of the recesses 11D on the first surface 11 of the insulating substrate 10 with the Ti oxides 13 in between. Hereinafter, contact of the Ni film 30 and the recesses 11D with the Ti oxides 13 in between may be simply referred to as contact of the Ni film 30 and the recesses 11D. Hereinafter, of the recesses 11D, those with which the Ni film 30 is in contact may be referred to as contact recesses 11Da. The contact recesses 11D may include the compound recesses 11DW.

As shown in FIG. 1C, the contact recesses 11Da align along the side surface 22 (lower side 22e of the side surface 22, to be specific) of the wiring conductor 20. Further, as shown in FIG. 2, the protrusion 31 of each Ni film 30, the protrusion 31 being in contact with the insulating substrate 10, is present around the entire perimeter of the wiring conductor 20, and the contact recesses 11Da are present around the entire perimeter under the protrusion 31 as shown in FIG. 1C. Thus, the contact recesses 11Da surround the wiring conductor 20 and are present at least in four directions around the wiring conductor 20. The contact recesses 11Da include those partly uncovered with the Ni film 30 and exposed and those fully covered with the Ni film 30 and not exposed. The contact recesses 11Da fully covered with the Ni film 30 mean that the protrusion 31 protrudes to positions beyond the contact recesses 11Da.

In a section perpendicular to the first surface 11 and the side surface 22 of the wiring conductor 20, the wiring substrate 1 may include a point where two or more contact recesses 11Da are present under the Ni film 30. Presence of the protrusion 31 of the Ni film 30 increases the contact area between the Ni film 30 and the insulating substrate 10, and enables the Ni film 30 to contact more recesses 11D.

Figure 3A:
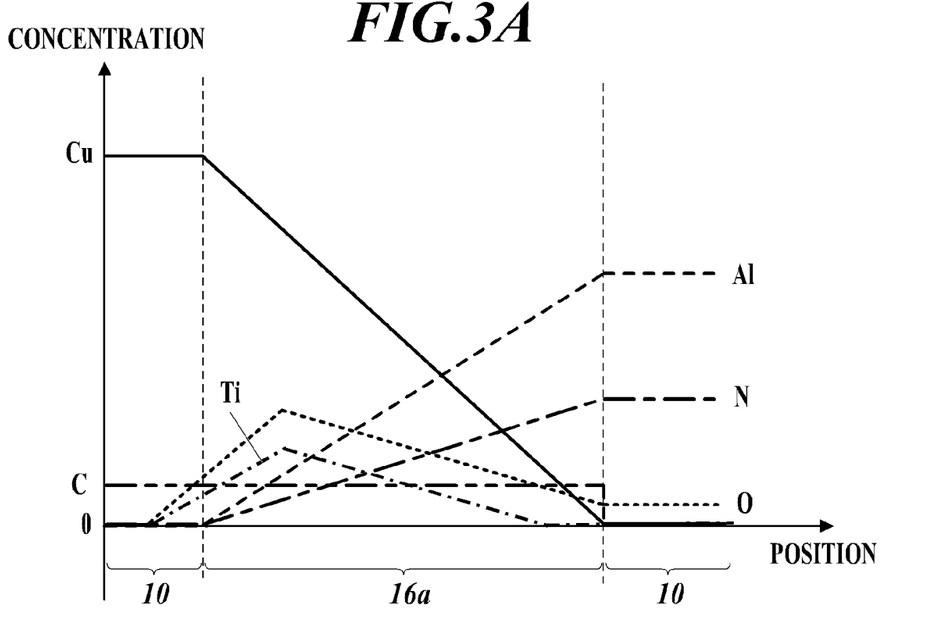
FIG. 3A shows concentration distributions of constituent elements in an interlayer between a wiring conductor and an insulating substrate.
Figure 3B:
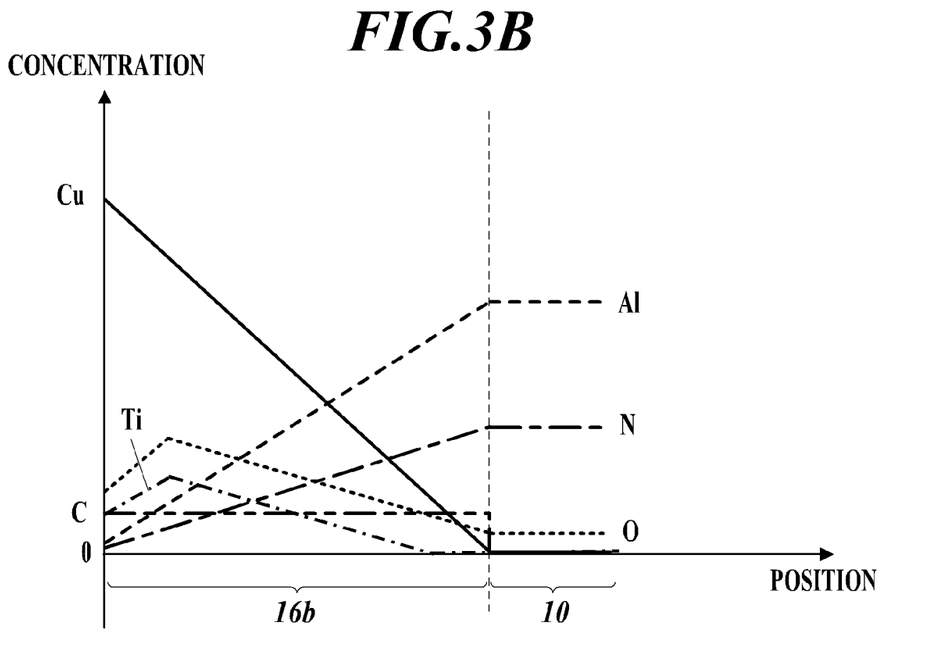
FIG. 3B shows concentration distributions of the constituent elements in an interlayer under the Ni film.

FIG. 3A shows concentration distributions of constituent elements in the interlayer between the wiring conductor and the insulating substrate. FIG. 3B shows concentration distributions of the constituent elements in the interlayer under the Ni film. The constituent elements and the concentration distributions in the interlayers 16a, 16b described hereinafter are results of measurement with electron energy loss spectroscopy (TEM-EELS). The concentrations are expressed with at % (atomic percent).

The interlayer 16a present at the interface between the wiring conductor 20 and the recesses 11D has a thickness of, for example, 20 nm to 80 nm, and as shown in FIG. 3A, contains Al (aluminum), N (nitrogen), Cu (copper), Ti (titanium) and O (oxygen). The interlayer 16a has concentration gradients in which Al, N and Cu concentrations gradually change. Al and N concentration gradients are each a gradient in which the closer the position in the interlayer 16a is to the wiring conductor, the lower the concentration is, and Cu concentration gradient is a gradient in which the closer the position in the interlayer 16a is to the wiring conductor 20, the higher the concentration is. These concentration gradients may exist from the wiring conductor 20 side to the insulating substrate 10 side of the interlayer 16a.

The interlayer 16b present at the interface between the Ni film 30 and the contact recesses 11Da has a thickness of, for example, 20 nm to 80 nm, and as shown in FIG. 3B, contains Al, N, Cu, Ti and O. The interlayer 16b has concentration gradients in which Al, N and Cu concentrations gradually change. Al and N concentration gradients are each a gradient in which the closer the position in the interlayer 16b is to the Ni film 30, the lower the concentration is, and Cu centration gradient is a gradient in which the closer the position in the interlayer 16b is to the Ni film 30, the higher the concentration is. These concentration gradients may exist from the Ni film 30 side to the insulating substrate 10 side of the interlayer 16b.

The interlayers 16a, 16b may contain 10 at % or less of C (carbon). C concentration of 10 at % or less may be approximately the same as C concentration in the wiring conductor 20.

Figure 4A:
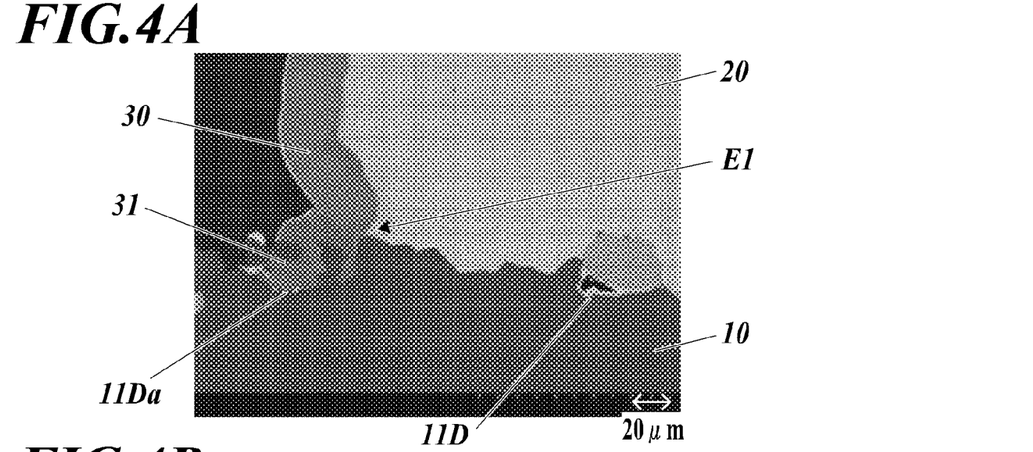
FIG. 4A shows an electron microscope image of one lower end part of the wiring conductor in the wiring substrate of the embodiment.
Figure 4B:
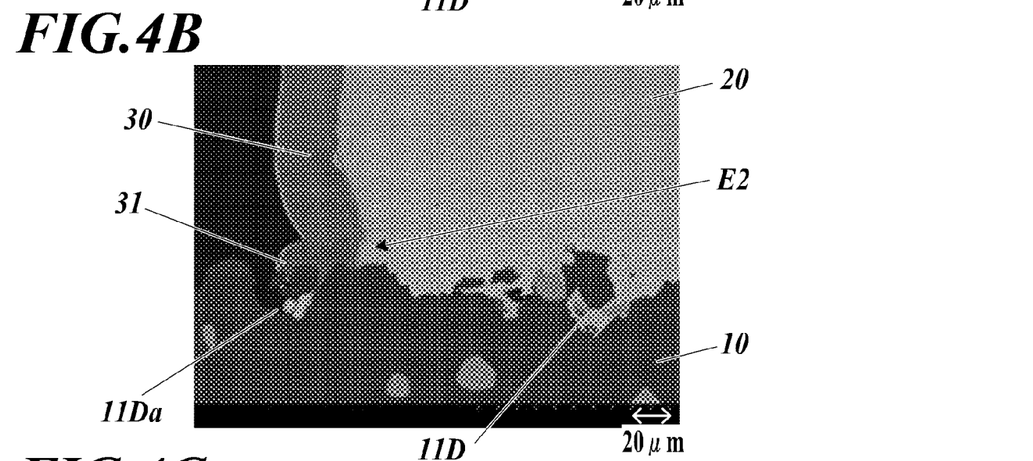
FIG. 4B shows an electron microscope image of one lower end part of the wiring conductor in the wiring substrate of the embodiment.
Figure 4C:
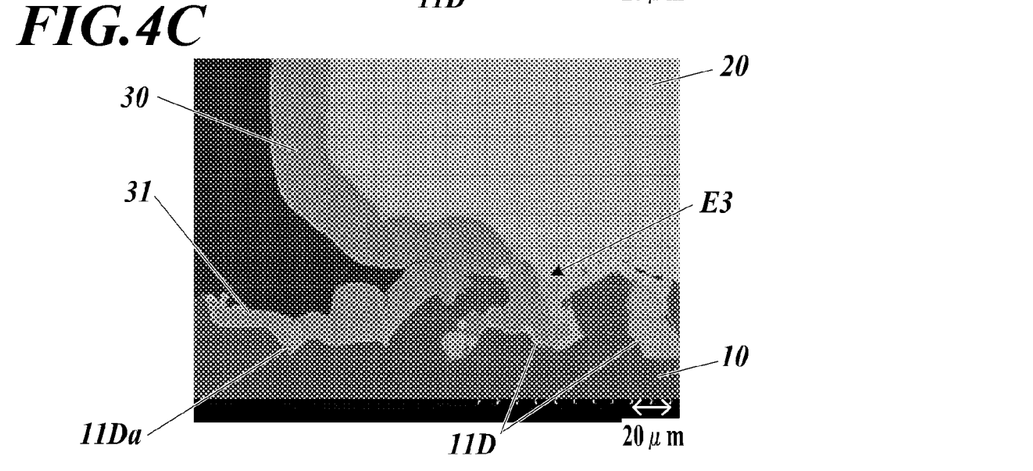
FIG. 4C shows an electron microscope image of one lower end part of the wiring conductor in the wiring substrate of the embodiment.

FIG. 4A to FIG. 4C each show an electron microscope image of a lower end part of the wiring conductor in the wiring substrate of the embodiment. As shown in FIG. 4A to FIG. 4C, although in practice, an inwardly curved shape (undercut) is generated at a lower end corner E1/E2/E3 of the wiring conductor 20, the Ni film 30 extends along the side surface of the wiring conductor 20 to the lower end corner E1/E2/E3 of the wiring conductor 20. The Ni film 30 partly protrudes from the lower end corner E1/E2/E3 of the wiring conductor 20 to the side opposite the wiring conductor 20 along the first surface 11 of the insulating substrate 10, thereby forming the protrusion 31. The border between the Ni film 30 including the protrusion 31 and the insulating substrate 10 includes the contact recesses 11Da. If the interface in the contact recesses 11Da is measured with energy dispersive X-ray spectroscopy (EDS) or electron energy loss spectroscopy, Ti and O are observed.

<Manufacturing Method>

Figure 5:
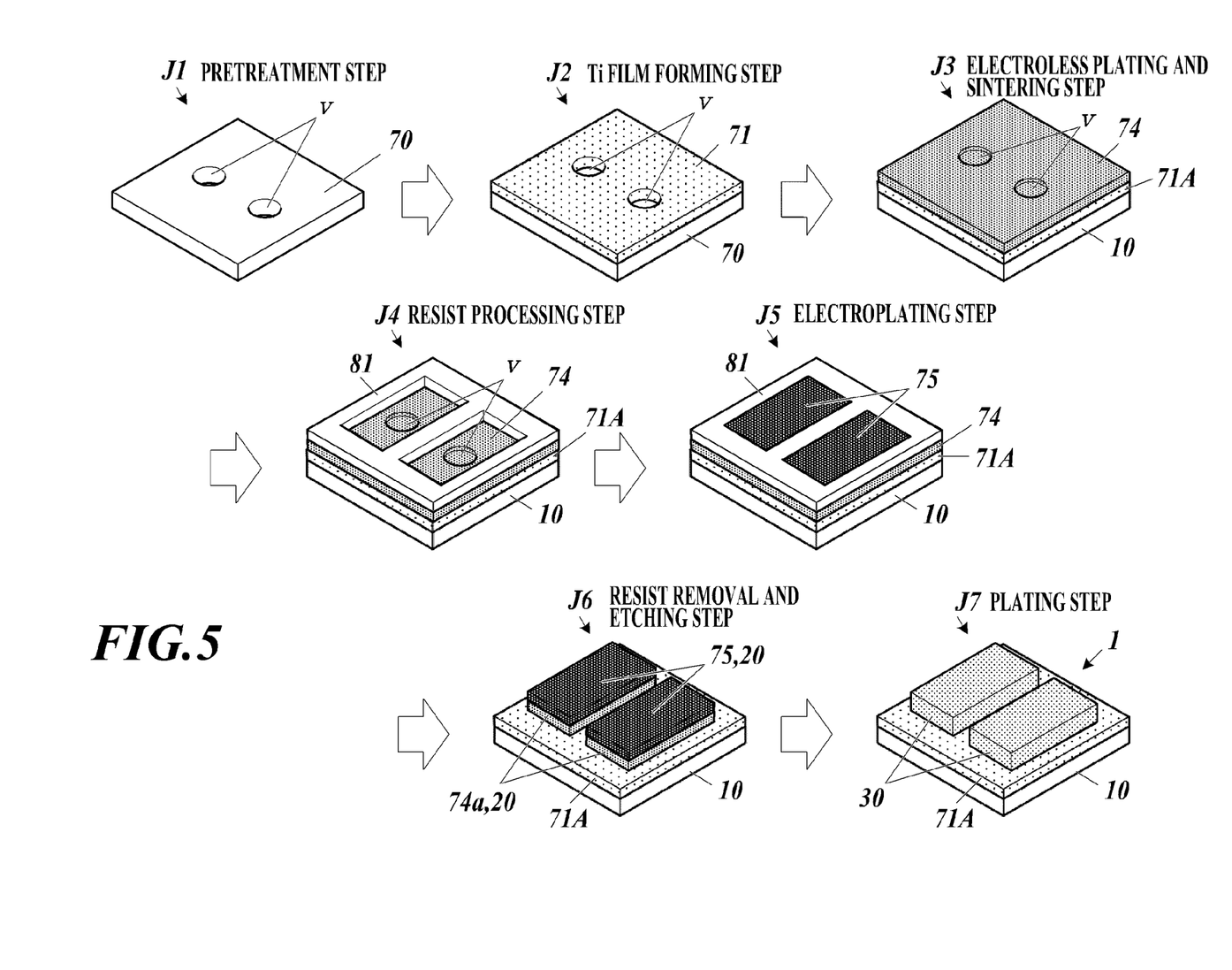
FIG. 5 is a diagram to explain an example of a manufacturing method of the wiring substrate of the embodiment.

FIG. 5 shows a diagram to explain a manufacturing method of the wiring substrate of the embodiment.

The manufacturing method of the wiring substrate 1 of the embodiment includes, in chronological order, a pretreatment step J1, a Ti film forming step J2, an electroless plating and sintering step J3, a resist processing step J4, an electroplating step J5, a resist removal and etching step J6, and a plating step J7.

In the pretreatment step J1, a ceramic green sheet(s) 70 of pre-sintered ceramic is molded into the shape of a substrate by punching, die machining or the like. The ceramic green sheet 70 may be provided with vias v for electrical conduction into the substrate. In order to form the insulating substrate 10, the ceramic green sheet 70 is sintered. In the pretreatment step J1, a pre-sintered or sintered ceramic green sheet(s) 70 may be anisotropically etched by using a chemical(s) or reactive ions. This anisotropic etching can control the size and density of the recesses 11D on the first surface 11 and the second surface 12 of the insulating substrate 10.

The Ti film forming step J2 is a step of applying an organic Ti solution to a pre-sintered or sintered ceramic green sheet(s) and sintering these. This sintering may be performed under conditions of 400° C. or higher and 30 minutes or longer, for example. This sintering transforms the organic Ti solution 71 into a solidified titanium oxide layer 71A. The sintering for the titanium oxide layer 71A and the sintering on the ceramic green sheet 70 may be performed in parallel.

In the electroless plating and sintering step J3, after electroless Cu plating is performed on the insulating substrate 10 having the titanium oxide layer 71A, sintering is performed thereon to diffuse elements at the interface. Conditions for this sintering may be 300° C. or higher and 30 minutes or longer in an atmosphere of an inert gas. The electroless Cu plating forms a Cu plating layer 74, and the sintering forms the interlayers 16a, 16b described above. The titanium oxide layer 71A and the Cu plating layer 74 that have undergone this sintering function as a seed layer. Since the seed layer is formed by wet process, manufacturing cost is reduced.

In the resist processing step J4, a pattern for the wiring conductors 20 (shown in FIG. 2) is formed on the Cu plating layer 74 with a DFR (Dry Film Resist) 81, for example. In the Cu electroplating step J5, Cu electroplating is performed on the Cu plating layer 74 in accordance with the pattern of the DFR 81 to form Cu conductors 75 having a predetermined thickness. If the vias v have been formed in the insulating substrate 10, the vias v are filled with the Cu conductors 75 in the Cu electroplating step J5.

In the resist removal and etching step J6, first, the DFR 81 is removed. Removal of the DFR exposes the seed layer (Cu plating layer 74 and titanium oxide layer 71A). Thereafter, the exposed seed layer is etched by using a chemical(s). The amount of etching is controlled such that the components of the titanium oxide layer 71A remain in the recesses 11D of the insulating substrate 10. In the steps J6 and J7, although it is depicted in a simplified form in FIG. 5, the titanium oxide layer 71A is not in the shape of a layer but scattered so as to be present in the recesses 11D.

In the plating step J7, electroless Ni plating is performed on a side where the Cu conductors 75 are formed, so that the Ni films 30 cover the Cu conductors 75 and the peripheries of residues 74a of the Cu plating layer 74 under the Cu conductors 75. Further, since the components of the titanium oxide layer 71A remain in the recesses 11D on the insulating substrate 10, the Ni films 30 are formed so as to slightly extend on the insulating substrate 10 to contact the recesses 11D near the Cu conductors 75 and the residues 74a. In the plating step J7, in addition to the Ni films 30 being formed, the Ni films 30 may be plated with other metals (e.g. Pd (palladium) and Au (gold)).

By the above manufacturing method, the wiring substrate 1 of the embodiment can be manufactured.

<Electronic Device and Electronic Module>

Figure 6:
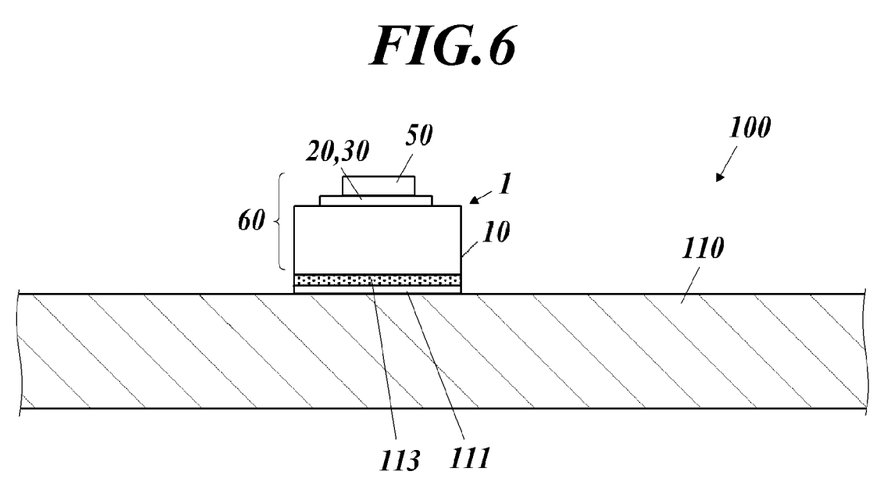
FIG. 6 is a sectional view of an electronic device and an electronic module according to an embodiment of the present disclosure.

FIG. 6 is a sectional view of an electronic device and an electronic module according to an embodiment of the present disclosure.

An electronic device 60 of this embodiment is configured by mounting an electronic component 50 on the wiring substrate 1. The electronic component 50 may be joined to the wiring conductor(s) 20 and the Ni film(s) 30 with a joining material. Electrodes of the electronic component 50 may be connected to the wiring conductor 20 and the Ni film 30 through bonding wires. On the Ni film 30, other metal films, such as a Pd film and an Au film, may be formed. The electronic device 60 may have a package that houses the wiring substrate 1 and the electronic component 50.

As the electronic component 50, various electronic components are applicable, which include: optical elements, such as an LD (Laser Diode), a PD (Photo Diode) and an LED (Light Emitting Diode); imagers, such as a CCD (Charge Coupled Device) image sensor and a CMOS (Complementary Metal Oxide Semiconductor) image sensor; piezoelectric vibrators, such as a crystal oscillator; surface acoustic wave devices; semiconductor devices, such as a semiconductor integrated circuit (IC) device; electric capacitors; inductors; and resistors.

An electronic module 100 of this embodiment is configured by mounting the electronic device 60 on a module board 110. On the module board 110, in addition to the electronic device 60, other electronic device(s), electronic element(s), electric element(s) and/or the like may be mounted. The module board 110 may be provided with an electrode pad 111, and the electronic device 60 may be joined to the electrode pad 110 with a joining material 113, such as solder. At a part of the electronic device 60 to which the joining material 113 is joined, the wiring conductor 20 and the Ni film 30 may be provided. If the electronic device 60 has a package, a wiring conductor of the package may be joined to the electrode pad 111 of the module board 110.

As described above, according to the wiring substrate 1 of an embodiment, the Ni film 30 covers the upper surface and the side surface of the wiring conductor 20 having Cu as a constituent element. Further, the foot of the Ni film 30 reaches the insulating substrate 10 and is in contact with the Ti oxides 13. Thus, the foot of the Ni film 30 adheres to the insulating substrate 10 with the Ti oxides 13 in between with high strength, which can suppress separation of the Ni film 30 from the foot. This can suppress inconvenience, such as the following: the wiring conductor 20 is partly exposed due to the separation of the Ni 30, and consequently corrosion occurs at the exposed part or ion migration occurs from the exposed part onto the insulating substrate 10.

Further, according to the wiring substrate 1 of the embodiment, the Ni film 30 has the protrusion 31 that protrudes to the side opposite the wiring conductor 20 along the first surface 11 of the insulating substrate 10. The protrusion 31 increases the contact area between the Ni film 30 and the insulating substrate 10, and increases the number of contact recesses 11Da, which the Ni film 30 contacts. This can further increase adhesion strength of the foot of the Ni film 30 to the insulating substrate 10, and accordingly further suppress the separation of the Ni film 30.

Further, the protrusion 31 protrudes beyond at least one of the contact recesses 11Da. Hence, at least at this part, contact of the Ni film 30 and the contact recess 11Da with the Ti oxide 13 in between is obtained, and high adhesion strength of the Ni film 30 to the insulating substrate 10 is obtained.

Further, according to the wiring substrate 1 of the embodiment, the edge on the protruding side of the protrusion 31 has a shape in which the hills h1 to h4 and the valleys c1 to c3 are included as viewed in the direction perpendicular to the first surface 11 of the insulating substrate 10 (FIG. 1B). Hence, on the insulating substrate 10 where the recesses 11D are randomly arranged, the Ni film 30 contacts many recesses 11D at the hills h1 to h4 of the protrusion 31 to increase the adhesion strength. On the other hand, at a part(s) where a small number of recesses 11D are present, the valleys c1 to c3 are arranged to shorten a part(s) having low adhesion strength. In the case where the recesses 11D are randomly arranged, the hills/valleys of the protrusion 31 are arranged in such a manner in many areas. The work of these further increases the adhesion strength of the protrusion 31 to the insulating substrate 10, and can provide a characteristic of the separation being more unlikely to occur.

Further, according to the wiring substrate 1 of the embodiment, the contact recesses 11Da, which contact the Ni film 30, align along the edge of the wiring conductor 20. In addition, the contact recesses 11Da, which contact the Ni film 30, surround the wiring conductor 20. Such configuration can suppress the separation of the Ni film 30 from the foot at many points around the wiring conductor 20.

Further, according to the wiring substrate 1 of the embodiment, in a longitudinal section perpendicular to the first surface 11 of the insulating substrate 10 and the side surface 22 of the wiring conductor 20, the Ni film 30 is in contact with two or more recesses 11D. The Ni film 30 being in contact with two or more recesses 11D can provide high adhesion strength of the Ni film 30 to the insulating substrate 10, and accordingly further suppress the separation of the Ni film 30 from the foot.

Further, according to the wiring substrate 1 of the embodiment, the recesses 11D that are in contact with the Ni film 30 include the compound recesses 11DW each having a shape of two or more recesses 11D overlapped if the individual recesses 11D are regarded as granular. The compound recesses 11DW increase the contact area between the Ni film 30 and the compound recesses 11DW with the Ti oxides 13 in between. This can provide high adhesion strength of the Ni film 30 to the insulating substrate 10, and accordingly further suppress the separation of the Ni film 30 from the foot.

Further, according to the wiring substrate 1 of the embodiment, the interface between the insulating substrate 10 and the wiring conductor 20 includes the interlayer 16a having Cu, Al and N concentration gradients. Presence of the interlayer 16a reduces stress at the interface caused by thermal expansion, and accordingly can suppress adhesion failure between the insulating substrate 10 and the wiring conductor 20 caused by thermal expansion.

Further, according to the wiring substrate 1 of the embodiment, the interface between the Ni film 30 and the recesses 11D includes the interlayer 16b having Cu, Al and N concentration gradients. Since coefficients of thermal expansion of Cu and Ni are close to one another, presence of the interlayer 16b reduces stress at the interface caused by thermal expansion, and accordingly can suppress adhesion failure between the insulating substrate 10 and the Ni film 30 caused by thermal expansion, and further suppress the separation of the Ni film 30 from the foot.

According to the electronic device 60 and the electronic module 100 of an embodiment, the wiring substrate 1 having the Ni film 30, the separation of which has been suppressed, is mounted therein. This can enhance reliability thereof.

In the above, some embodiments of the present disclosure have been described. However, the present invention is not limited thereto. For example, in the above embodiments, examples of the size and the density of the recesses 11D on the insulating substrate 10 have been described, but the size and the density thereof are not limited thereto. Further, in the above embodiments, the Ni film 30 covers the entire upper surface and the entire side surface of the wiring conductor 20, but may not cover part thereof. Still further, in the above embodiments, the Ni film 30 has the protrusion 31, but may not have a shape corresponding to the protrusion 31. Yet further, in the above embodiments, an example of the manufacturing method of the wiring substrate 1 has been described, but the wiring substrate 1 may be manufactured by another manufacturing method. The details described in the embodiments can be appropriately modified within a range not departing from the scope of the invention.

INDUSTRIAL APPLICABILITY

The present disclosure is applicable to a wiring substrate, an electronic device and an electronic module.

The invention claimed is:

1. A wiring substrate comprising:
an insulating substrate having a first surface and a second surface on a side opposite the first surface, and containing AlN;
a conductor disposed on the first surface and containing Cu; and
an Ni film disposed so as to extend across an upper surface and a side surface of the conductor to the first surface,
wherein Ti oxide is scattered so as to be at a plurality of points on the first surface.

2. The wiring substrate according to claim 1, wherein the Ni film has a part that is in contact with the Ti oxide.

3. The wiring substrate according to claim 2,
wherein the Ni film has a protrusion that protrudes to a side opposite the conductor along the first surface, and
wherein the protrusion is in contact with the first surface.

4. The wiring substrate according to claim 3, wherein the protrusion protrudes beyond, of the Ti oxide, at least one Ti oxide being in contact with the Ni film.

5. The wiring substrate according to claim 3, wherein an outer edge on a protruding side of the protrusion has a plurality of hills and a plurality of valleys as viewed in a direction perpendicular to the first surface.

6. The wiling substrate according to claim 4, wherein an outer edge on a protruding side of the protrusion has a plurality of hills and a plurality of valleys as viewed in a direction perpendicular to the first surface.

7. The wiring substrate according to claim 2, wherein, of the Ti oxide, a plurality of Ti oxides being in contact with the Ni film aligns along the side surface of the conductor.

8. The wiring substrate according to claim 2, wherein, of the Ti oxide, a plurality of Ti oxides being in contact with the Ni film surrounds the conductor.

9. The wiring substrate according to claim 2, wherein in at least one section perpendicular to the first surface and the side surface, the Ni film is in contact with two or more Ti oxides of the Ti oxide.

10. The wiring substrate according to claim 2,
wherein the first surface has a plurality of recesses, and
wherein the plurality of recesses includes a recess having a shape of two or more grains overlapped.

11. The wiring substrate according to claim 2, further comprising an interlayer between the insulating substrate and the conductor, the interlayer having concentration gradients in which Cu concentration is higher as a position in the interlayer is closer to the conductor, and Al concentration and N concentration are lower as the position in the interlayer is closer to the conductor.

12. The wiring substrate according to claim 2, further comprising an interlayer between the Ni film and the first surface, the interlayer having concentration gradients in which Cu concentration is higher as a position in the interlayer is closer to the Ni film, and Al concentration and N concentration are lower as the position in the interlayer is closer to the Ni film.

13. An electronic device comprising:
the wiring substrate according to claim 1; and
an electronic component mounted on the wiring substrate.

14. An electronic module comprising:
the electronic device according to claim 13; and
a module board where the electronic device is mounted.

* * * * *